(12) United States Patent
Moon et al.

(10) Patent No.: US 11,373,428 B2
(45) Date of Patent: Jun. 28, 2022

(54) DISPLAY DEVICE INCLUDING SENSOR

(71) Applicant: LG DISPLAY CO., LTD., Seoul (KR)

(72) Inventors: TaeHyoung Moon, Gyeonggi-do (KR); JaeHyun Kim, Gyeonggi-do (KR); SungJin Lee, Gyeonggi-do (KR); DeukHo Yeon, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 192 days.

(21) Appl. No.: 16/901,848

(22) Filed: Jun. 15, 2020

(65) Prior Publication Data

US 2020/0410196 A1 Dec. 31, 2020

(30) Foreign Application Priority Data

Jun. 25, 2019 (KR) .................. 10-2019-0075956

(51) Int. Cl.
*G06K 9/00* (2022.01)
*G06V 40/13* (2022.01)
*B06B 1/06* (2006.01)
*H01L 27/15* (2006.01)
*H01L 27/32* (2006.01)
(Continued)

(52) U.S. Cl.
CPC ........ *G06V 40/1306* (2022.01); *B06B 1/0207* (2013.01); *B06B 1/0688* (2013.01); *H01L 27/156* (2013.01); *H01L 27/3234* (2013.01); *H01L 27/3262* (2013.01); *H01L 27/3265* (2013.01); *H01L 27/3276* (2013.01); *B06B 2201/70* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(58) Field of Classification Search
CPC .................. G06V 40/1306; B06B 1/0207; B06B 1/0688; B06B 2201/70; H01L 27/156; H01L 27/3234; H01L 27/3262; H01L 27/3265; H01L 27/3276; H01L 27/1225; H01L 27/1224; H01L 27/1251; H01L 27/1255; H01L 29/78675; H01L 29/7869

See application file for complete search history.

(56) References Cited

U.S. PATENT DOCUMENTS

2019/0251378 A1\* 8/2019 Jung .................. G06V 40/1306

\* cited by examiner

*Primary Examiner* — Abdul-Samad A Adediran
(74) *Attorney, Agent, or Firm* — Birch, Stewart, Kolasch & Birch, LLP

(57) ABSTRACT

A display device can include a display panel including display pixels having light emitting elements, and sensing pixels including piezoelectric elements; and a driving circuit configured to drive the display panel, in which the display panel further includes a substrate; a thin film transistor array disposed on the substrate, the thin film transistor array including display driving transistors included in the display pixels; a sensor array disposed on the thin film transistor array, the sensor array including sensor driving transistors included in the sensing pixels; a piezoelectric element layer disposed on the sensor array, the piezoelectric element layer including the piezoelectric elements connected to the sensor driving transistors; and a light emitting element layer disposed on the piezoelectric element layer, the light emitting element layer including the light emitting elements, and anode electrodes of the light emitting elements are connected to the display driving transistors.

20 Claims, 11 Drawing Sheets

(51) Int. Cl.
_B06B 1/02_ (2006.01)
_H01L 29/786_ (2006.01)
_H01L 27/12_ (2006.01)

DISPLAY DEVICE INCLUDING SENSOR

CROSS REFERENCE TO RELATED APPLICATION

This application claims priority to Korean Patent Application No. 10-2019-0075956, filed on Jun. 25, 2019 in the Republic of Korea, which is hereby incorporated by reference for all purposes as if fully set forth herein.

BACKGROUND

Field

Embodiments of the present disclosure relate to a display device including a sensor.

Description of Related Art

Along with the development of the information society, the demand for display devices for displaying images is increasing in various fields. These display devices may include a liquid crystal display (LCD), an organic light emitting display (OLED), a quantum dot light emitting display (QLED), and the like.

Display devices are currently in use for various electronic devices, such as a smart phone, a tablet, a notebook computer, a monitor, a TV and so on, and particularly, in recent years, the use of electronic devices, such as smartphones, tablets, and notebook computers, has remarkably increased owing to the ever-increasing developments of mobile communication technologies. In addition to the conventional communication function, these electronic devices tend to be used more often to store personal information, such as e.g., contact information, call history, messages, photos, memos, web surfing information of the user, location information, and financial information. Therefore, with a view to preventing such personal information from leaking out of the electronic devices, a variety of security solutions have been devised and applied to those electronic devices to protect the personal information.

Further, a security solution utilizing various biometric information of the user, among those security solutions, has been recently developed. Because biometric information of a user is unique and inherent to every person with various kinds of information, it would be extremely difficult for anyone other than its genuine user to unlock the user's electronic device, whereas it would be of great advantage that a legitimate user can unlock the electronic device by means of authentication using his/her own biometric information, with ease and convenience.

However, in the situation where a sensor for use in identifying the biometric information is to be first manufactured in a separate line and thereafter, equipped to the electronic device, the electronic devices tend to experience a more complicated manufacturing process, which often leads to an increase in the thickness of the electronic device itself.

BRIEF SUMMARY

Embodiments of the present disclosure provide a display device including at least one sensor capable of simplifying the manufacturing process and achieving a thinner thickness of the display device.

Further, embodiments of the present disclosure provide a display device including at least one sensor capable of utilizing biometric information of a user.

According to one aspect, the embodiments of the present disclosure provide a display device including a display panel including a plurality of display pixels including light emitting elements, and a plurality of sensing pixels including piezoelectric elements; and a driving circuit for driving the display panel, the display panel including a substrate; a thin film transistor array disposed on the substrate, on which thin film transistor array are disposed a plurality of display driving transistors included in the display pixels; a sensor array disposed on the thin film transistor array, on which sensor array are disposed a plurality of sensor driving transistors included in the sensing pixels; a piezoelectric element layer including the piezoelectric elements and disposed on the sensor array, the piezoelectric elements being connected to the sensor driving transistors; and a light emitting element layer including the light emitting elements and disposed on the piezoelectric element layer, in which anode electrodes of the light emitting elements are connected to the display driving transistors.

According to embodiments of the present disclosure, a display device including at least one sensor capable of simplifying the manufacturing process and implementing a thinner thickness can be provided.

According to embodiments of the present disclosure, a display device including at least one sensor capable of utilizing its user's biometric information can be provided.

BRIEF DESCRIPTION OF DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1A:
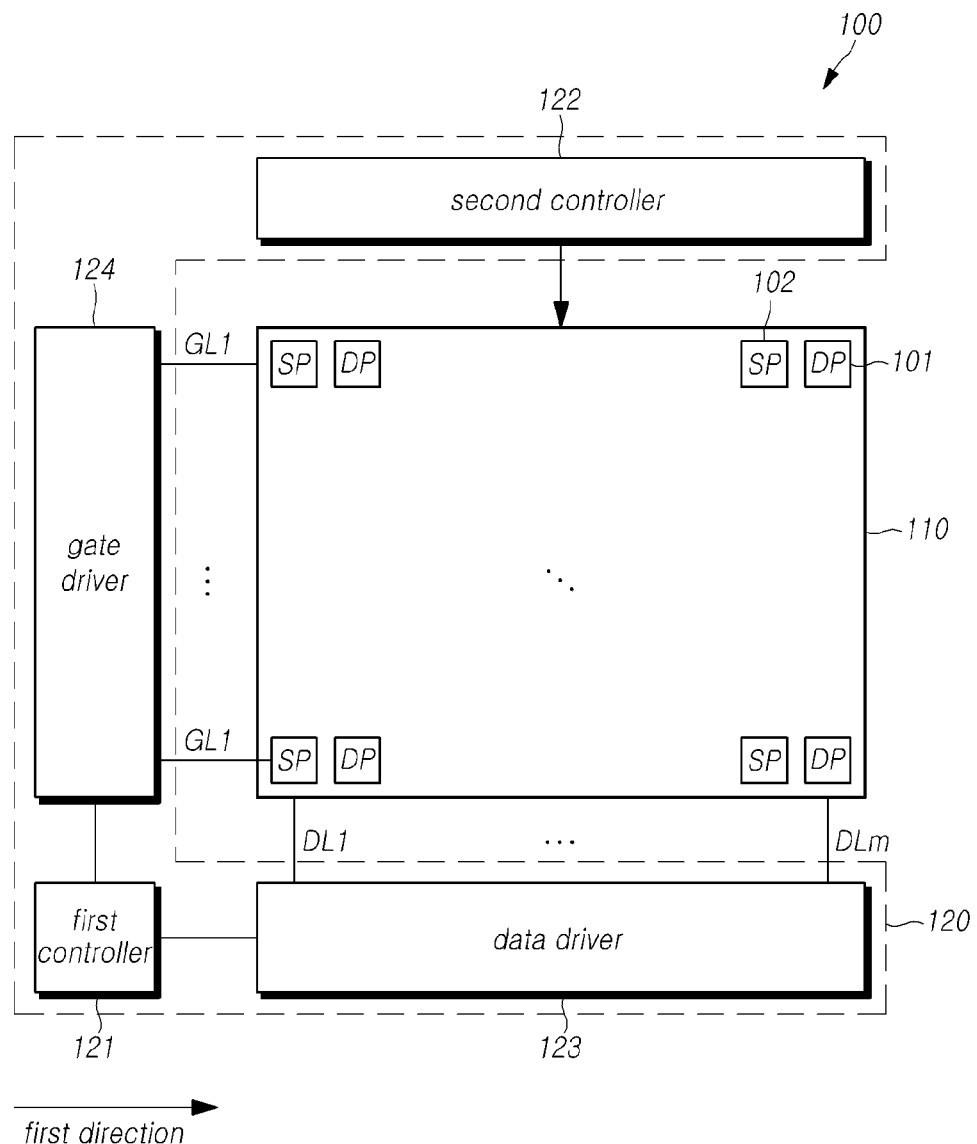
FIG. 1A illustrates a schematic configuration of a display device including a sensor according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element may be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1A illustrates a schematic configuration of an embodiment of a display device 100 including at least one sensor according to embodiments of the present disclosure. All components of the display device according to all embodiments of the present disclosure are operatively coupled and configured.

Referring to FIG. 1A, the display device 100 may include a display panel 110 having at least one display pixel 101 including a plurality of light emitting elements and at least one sensing pixel 102 including a plurality of piezoelectric elements, and a driving circuit 120 for driving the display panel 110.

The display panel 110 that is adapted to display image may include at least one sensor to sense biometric information of a user in use. The sensing performed on the display panel 110 may be to recognize an object approaching the display panel 110 by using an ultrasonic signal and to identify biometric information of the approached object. The user's biometric information may include fingerprints, irises, facial contours, finger veins, and the like, although not limited to these.

The display panel 110 may include a plurality of gate lines GL1, . . . , GLn and a plurality of data lines DL1, . . . , DLn. The display panel 110 may further include a plurality of display pixels 101 each connected with the plurality of gate lines GL1, . . . , GLn and the plurality of data lines DL1, . . . , DLn, although lines disposed on the display panel 110 are not exclusively limited to the above. Those light emitting elements included in the plurality of display pixels 101 may emit any one of red, green, and blue light, although the color of light emitted from the light emitting elements is not limited thereto.

The display panel 110 may include a plurality of sensing pixels 102 for outputting an ultrasonic signal. Further, when the ultrasonic signal output from the sensing pixel 102 is reflected onto an object, the sensing pixel 102 may receive the reflected ultrasonic signal to generate a sensing signal. The piezoelectric elements included in the sensing pixel 102 may receive an electrical signal to output an ultrasonic signal, and then receive the ultrasonic signal to generate the sensing signal corresponding to the electrical signal.

Further, the plurality of display pixels 101 and the plurality of sensing pixels 102 may be disposed in the display panel 110. Furthermore, the plurality of display pixels 101 and the plurality of sensing pixels 102 may be connected to each other. Here, although the display pixel 101 and the sensing pixel 102 are shown to be arranged adjacent to each other in a first direction, the arrangement is not limited thereto, and the display pixels 101 may be disposed on a different layer from the sensing pixels 102 and/or overlap each other.

The driving circuit 120 may include a first controller 121 for controlling the display pixels 101, a second controller 122 for controlling the sensing pixels 102, a data driver 123 supplying a data signal to the display panel 110, and a gate driver 124 supplying a gate signal to the display panel 110, although elements included in the driving circuit 120 are not limited thereto.

The first controller 121 may control the data driver 123 and the gate driver 124, thereby outputting a data signal from the data driver 123 and outputting a gate signal from the gate driver 124. The first controller 121 may transmit an image signal to the data driver 123, which may be controlled by the first controller 121, and the image signal received from the first controller 121 may be converted to the data signal and output to the plurality of data lines DL1, . . . , DLm. The gate driver 124 may be controlled by the first controller 121, and the gate signal output from the gate driver 124 may be output to the plurality of gate lines GL1, . . . , GLn.

The display panel 110 may receive a data signal by a gate signal, wherein the data signal may be transferred as a data voltage Vdata having a voltage level corresponding to gradation, and the display pixel 101 receiving the gate signal may receive the data voltage Vdata. Here, the data driver 123 and the gate driver 124 included in the display device 100 are respectively illustrated as a single element, but their arrangement is not limited thereto.

The display device 100 may include a plurality of data drivers 123 corresponding to the resolution and size of the display panel 110 as required. Alternatively, the gate driver 124 may be disposed on the left and right sides of the display panel 110, and the gate driver 124 may be incorporated into the display panel 110. Furthermore, the data driver 123 and the gate driver 124 may be advantageously an integrated circuit.

The second controller 122 may be adapted to control outputting of the ultrasonic signal from the sensing pixel 102. Further, the second controller 122, when the sensing pixel 102 receives the reflected ultrasonic signal, may be adapted to control the sensing pixel 102 to output the sensing signal in response to the ultrasonic signal received from the sensing pixel 102. The plurality of sensing pixels 102 and the second controller may be referred to as a sensor.

The first controller 121 may be a timing controller, and the second controller 122 may be a microcontroller unit (MCU), although not limited thereto. Here, the first controller 121 and the second controller 122 are shown as separate components, although are not limited thereto, and they may be included within a single integrated circuit.

Figure 1B:
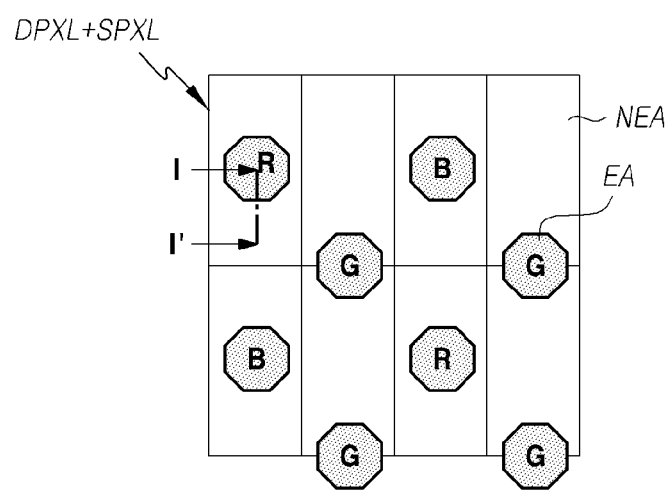
FIG. 1B illustrates a plan view of a schematic configuration of part of a display panel according to embodiments of the present disclosure.

FIG. 1B is a plan view illustrating a schematic structure of part of a display panel according to embodiments of the present disclosure.

Referring to FIG. 1B, the display panel 110 may include a light emitting area EA and a non-light emitting area NEA, wherein the light emitting area EA may include a display pixel 101 and a sensing pixel 102. The display pixel 101 and the sensing pixel 102 may be arranged in regions separated from each other in the light emitting area EA, and the display pixel 101 and the sensing pixel 102 may be arranged to partially overlap each other.

The number of sensing pixels 102 may be substantially the same as the number of display pixels 101. Alternatively, the number of sensing pixels 102 may be less than the number of display pixels 101. In a situation where the number of sensing pixels 102 is less than that of the display pixels 101, an arrangement made be made so that one sensing pixel 102 may be connectable to two or more display pixels 101. Here, the display pixel 101 may be disposed in the light emitting area EA, while the sensing pixel 102 may be disposed in part of the light emitting area EA and the non-light emitting area NEA. Further, it should be noted that although the display pixel 101 may emit light of either one of red, green and blue colors, the color of light emitted from the display pixel 101 is not limited thereto.

Figure 2:
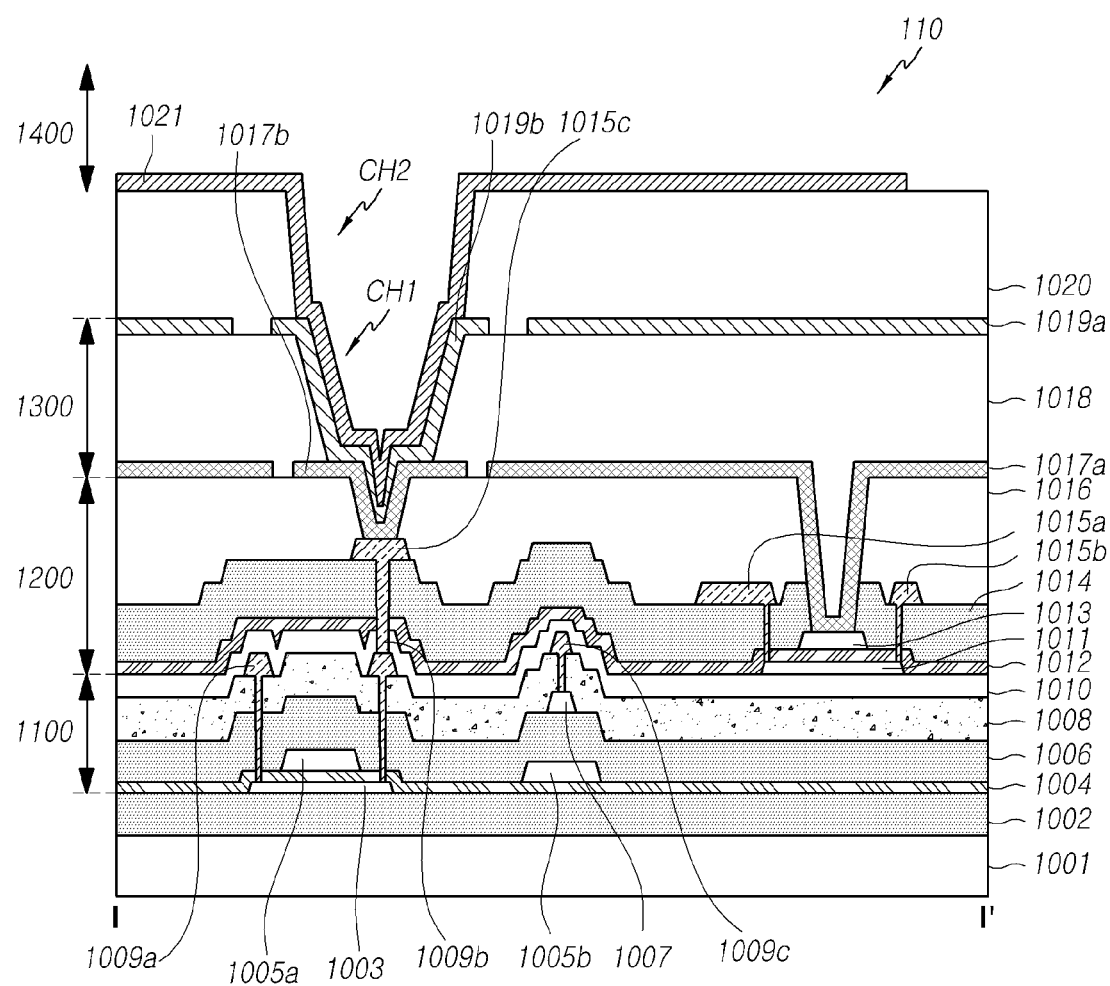
FIG. 2 illustrates a cross-sectional view of a cross section along line I-I' of FIG. 1B in a display panel according to embodiments of the present disclosure.

FIG. 2 illustrates a cross-sectional view of a cross section along line I-I' of FIG. 1B in the display panel according to embodiments of the present disclosure.

Referring to FIG. 2, the display panel 110 may include a substrate 1001, a thin film transistor array 1100 disposed on the substrate 1001, in the thin film transistor array are disposed display driving transistors included in the display pixels 101, a sensor array 1200 disposed on the thin film transistor array 1100, in the sensor array 1200 are disposed sensor driving transistors included in the sensing pixels 102, a piezoelectric element layer 1300 including piezoelectric elements and disposed on the sensor array 1200, the piezoelectric elements being connected to the sensor driving transistors, and a light emitting element layer 1400 including light emitting elements and disposed on the piezoelectric element layer 1300, anode electrodes of the light emitting elements being connected to the display driving transistors.

The substrate 1001 may include glass. Further, the substrate 1001 may include polyethylene, although not limited thereto. A buffer layer 1002 may be disposed on the substrate 1001, and the thin film transistor array 1100 may be disposed on the buffer layer 1002. Here, the buffer layer 1002 is illustrated as one layer, although it is not limited thereto.

The thin film transistor array 1100 may include a first semiconductor layer 1003 disposed on the buffer layer 1002, a first gate insulating film 1004 disposed on the first semiconductor layer 1003, a first gate electrode 1005a disposed on the first gate insulating film 1004, a first electrode 1005b of a capacitor disposed on the first gate insulating film 1004, a first planarization layer 1006 disposed on the first electrode 1005b and the first electrode 1005b of the capacitor, a second electrode 1007 of the capacitor disposed on the first planarization layer 1006, a second planarization layer 1008 disposed on the first planarization layer 1006 on which the second electrode 1007 of the capacitor is disposed, a first source electrode 1009a and a first drain electrode 1009b disposed on the second planarization layer 1008, and a protective layer 1010 disposed on the first source electrode 1009a and the first drain electrode 1009b. The first semiconductor layer 1003 may include either low-temperature polysilicon (LTPS) or an oxide semiconductor.

The first source electrode 1009a and the first drain electrode 1009b may be respectively connected to the first semiconductor layer 1003 disposed on the buffer layer 1002 through a contact hole. Here, the first gate electrode 1005a is illustrated as being disposed on the first semiconductor layer 1003, but it is not limited thereto, and the first gate electrode 1005a may be disposed underneath the first semiconductor layer 1003. The first semiconductor layer 1003, the first gate electrode 1005a, the first source electrode 1009a, and the first drain electrode 1009b of the thin film transistor array 1100 may be any one of the display driving transistors included in the display pixel 101.

In addition, a signal line 1009c connected to the second electrode 1007 of the capacitor may be formed in the second planarization layer 1008. The signal line 1009c may penetrate the second planarization layer 1008 to be connected to the second electrode 1007 of the capacitor. The signal line 1009c may be formed of substantially the same material as the first source electrode 1009a and the first drain electrode 1009b.

The sensor array 1200 may be disposed on the protective layer 1010 of the thin film transistor array 1100. The sensor array 1200 may include a second semiconductor layer 1011 disposed on the protective layer 1010 of the thin film transistor array 1100, a second gate insulating layer 1012 disposed on the second semiconductor layer 1011, a second gate electrode 1013 disposed on the second gate insulating layer 1012, a third planarization layer 1014 disposed on the second gate electrode 1013, a second source electrode 1015a and a second drain electrode 1015b disposed on the third planarization layer 1014, and a first insulating layer 1016 disposed on the second source electrode 1015a and the second drain electrode 1015b. The second semiconductor layer 1011 may include low-temperature polysilicon or an oxide semiconductor.

The second source electrode 1015a and the second drain electrode 1015b may be respectively connected to the second semiconductor layer 1011 disposed on the protective layer 1010 through a contact hole. The second semiconductor layer 1011, the second gate electrode 1013, the second source electrode 1015a, and the second drain electrode 1015b may be any one of the sensor driving transistors 102 included in the sensing pixel 102. The second semiconductor layer 1011, the second gate electrode 1013, the second source electrode 1015a and the second drain electrode 1015b may be respectively disposed to not mutually overlap the first semiconductor layer 1003, the first gate electrode 1005a, the first source electrode 1009a and the first drain electrode 1009b.

The piezoelectric element layer 1300 may be disposed on the sensor array 1200. Further, the piezoelectric element layer 1300 may be disposed on the first insulating film 1016. The piezoelectric element layer 1300 may include a sensing electrode line 1017a, a driving electrode line 1019a, and a piezoelectric material layer disposed between the sensing electrode line 1017a and the driving electrode line 1019a, in which piezoelectric material layer is formed a first hole CH1.

Further, the piezoelectric element layer 1300 may include a first auxiliary electrode line 1017b disposed to overlap the first hole CH1 in the lower surface of the piezoelectric material layer 1018 and spaced apart from the sensing electrode line 1017a, and a second auxiliary electrode line 1019b_disposed on an inner wall of the first hole CH1 and connected to the first auxiliary electrode line 1017b, and being spaced apart from the driving electrode line 1019a. The piezoelectric material layer 1018 may include polyvinylidene fluoride (PVDF), although not limited thereto.

The sensing electrode line 1017a may be connected to the sensor driving transistors and the sensing electrode line 1017a may be further connected to the second gate electrode 1013. Furthermore, the first auxiliary electrode line 1017b may be connected to the first drain electrode 1009b of the display driving transistor. Then, the first auxiliary electrode line 1017b may be connected to the first drain electrode 1009b via an extension electrode 1015c. This extension electrode 1015c may be connected to the first drain electrode 1009b through a contact hole formed in the third planarization film 1014, and the first auxiliary electrode line 1017b may be connected to the extension electrode 1015c through a contact hole formed in the first insulating film 1016.

The extension electrode 1015c may be disposed on the third planarization film 1014 like the second source electrode 1015a and the second drain electrode 1015b. The extension electrode 1015c may include substantially the same material as the second source electrode 1015a and the second drain electrode 1015b, although not limited thereto.

The sensing electrode line 1017a disposed on the first insulating film 1016 may be connected to the second gate electrode 1013 through a contact hole extending to the second gate electrode 1013. Further, the driving electrode line 1019a and the sensing electrode line 1017a may be respectively separated from the first auxiliary electrode line 1017b and the second auxiliary electrode line 1019b, so that the sensing electrode line 1017a and the driving electrode line 1019a are not connected to each other.

A second insulating layer 1020 may be disposed on the driving electrode line 1019a, and a light emitting element layer 1400 may be disposed on the second insulating film 1020. The light emitting element layer 1400 may include an anode electrode 1021 disposed on the second insulating film 1020. The light emitting element layer 1400 may further include a light emitting layer disposed on the anode electrode 1021 and a cathode electrode disposed on the light emitting layer. In addition, an encapsulation layer may be further disposed on the light emitting element layer 1400. However, layers disposed on the light emitting element layer 1400 are not limited thereto.

A second hole CH2, which is disposed to overlap the first hole CH1, may be formed in the second insulating film 1020 disposed over the driving electrode line 1019a, and the anode electrode 1021 may be disposed on the second insulating film 1020. The diameter of the second hole CH2 may be larger than that of the first hole CH1. Further, the anode electrode 1021 may be disposed along the inner walls of the second hole CH2 and the first hole CH1, and may be connected to the second auxiliary electrode line 1019b disposed on the inner wall of the first hole CH1. Thus, the anode electrode 1021 may be connected to the first drain electrode 1009b via the extension electrode 1015c and the first auxiliary electrode line 1017b connected to the second auxiliary electrode line 1019b.

Figure 3:
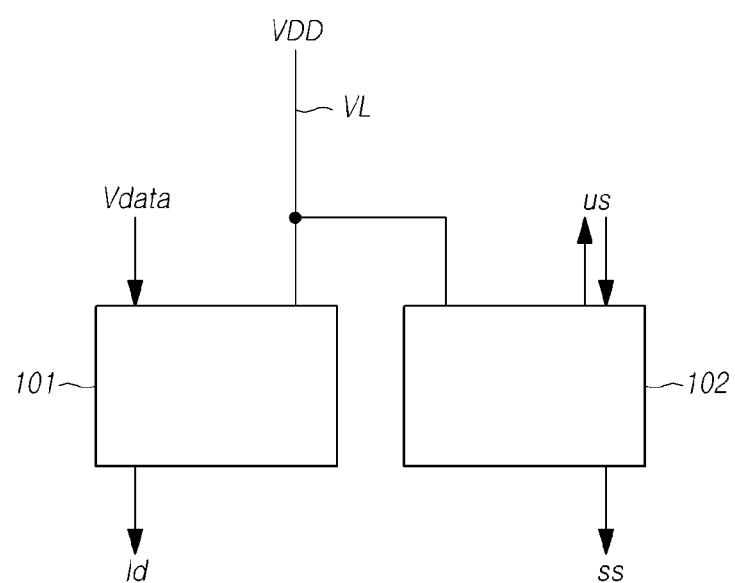
FIG. 3 shows a conceptual diagram illustrating the connection relationship between a display pixel and a sensing pixel according to embodiments of the present disclosure.

FIG. 3 shows a conceptual diagram illustrating the connection relationship between the display pixel and the sensing pixel according to embodiments of the present disclosure.

Referring to FIG. 3, the display pixel 101 can generate a driving current Id corresponding to a first driving voltage VDD and a data voltage Vdata. The sensing pixel 102 can generate a sensing signal ss using the first driving voltage VDD and an ultrasonic signal us. Accordingly, the display pixel 101 and the sensing pixel 102 may operate by receiving the first driving voltage VDD through the same driving power line VL. The sensing signal ss output from the sensing pixel 102 may include a first sensing signal and a second sensing signal, the second sensing signal being amplified from the first sensing signal.

Figure 4:
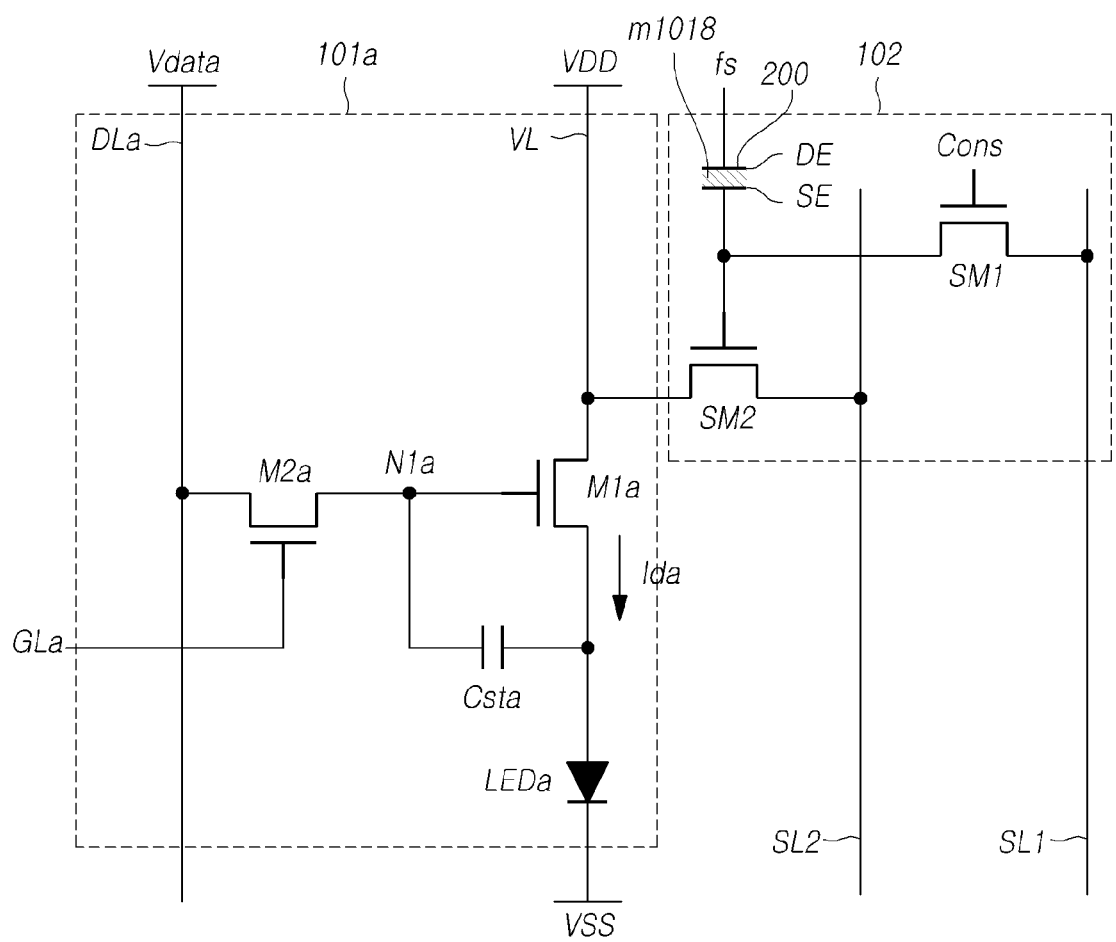
FIG. 4 is a circuit diagram illustrating an embodiment of a display pixel and a sensing pixel according to embodiments of the present disclosure.
Figure 5:
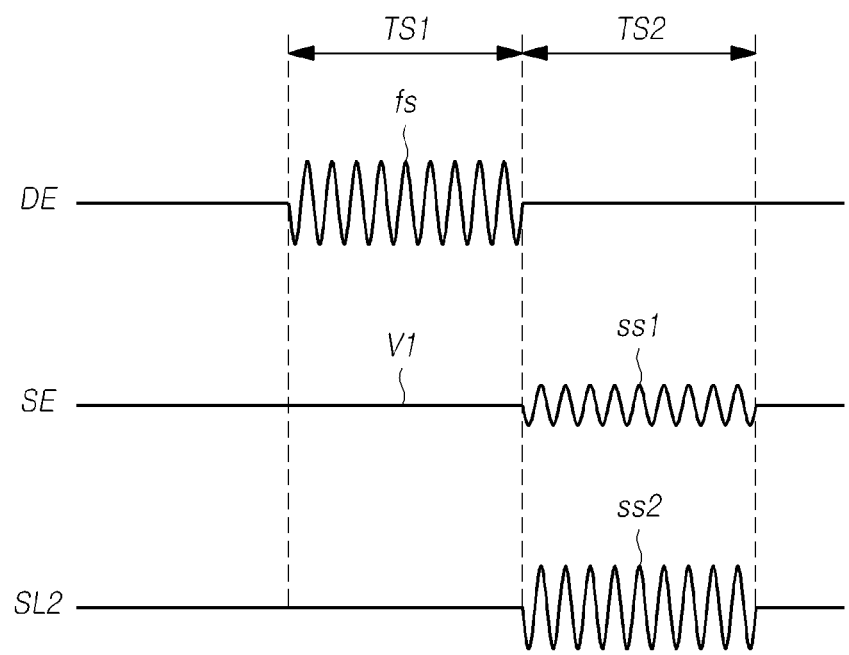
FIG. 5 is a timing diagram illustrating driving of a sensing pixel according to embodiments of the present disclosure.

FIG. 4 is a circuit diagram illustrating an embodiment of a display pixel and a sensing pixel according to embodiments of the present disclosure, and FIG. 5 is a timing diagram illustrating driving of the sensing pixel according to embodiments of the present disclosure.

Referring first to FIG. 4, a light emitting element LEDa may be disposed on the piezoelectric element layer 1300 as illustrated in FIG. 2. The light emitting element LEDa may include an anode electrode, a cathode electrode, and a light emitting layer disposed between the anode electrode and the cathode electrode. The light emitting element LEDa may be of an organic light emitting diode including an organic material of light emitting layer, or an inorganic light emitting diode including an organic material of light emitting layer.

The piezoelectric element 200 may include a sensing electrode SE, a driving electrode DE, and a piezoelectric material m1018 disposed between the sensing electrode SE and the driving electrode DE, respectively. The piezoelectric element 200 may be a piezoelectric element layer 1300 disposed on the sensor array 1200 illustrated in FIG. 2 or a part thereof. The sensing electrode SE and the driving electrode DE may be part of the sensing electrode line 1017a and the driving electrode line 1019a, and the piezoelectric material m1018 may be part of the piezoelectric material layer 1018 as shown in FIG. 2, respectively.

The display pixel 101a may include a first transistor M1a receiving the first driving voltage VDD and the data voltage Vdata to generate a driving current Ida corresponding to the data voltage Vdata for supplying the driving current Ida to the light emitting element LEDa, a second transistor M2a transferring the data voltage Vdata to the first transistor M1a in response to the gate signal, and a capacitor Csta for maintaining the data voltage Vdata transferred to the first transistor M1a. Here, the first transistor M1a may be the display driving transistor as shown in FIG. 2.

The first transistor M1a may be arranged so that the first electrode of the first transistor M1a is connected to a driving power line VL transferring the first driving voltage VDD, and the second electrode of the first transistor M1a is connected to an anode electrode of the light emitting element LEDa. Further, a gate electrode of the first transistor M1a may be connected to a first node N1a.

The second transistor M2a may be arranged so that the first electrode of the second transistor M2a is connected to the data line DL transferring the data voltage Vdata, and the second electrode of the second transistor M2a is connected to the first node N1a. Further, a gate electrode of the second transistor M2a may be connected to a gate line GL. The capacitor Csta may be arranged between the first node N1a and the anode electrode of the light emitting element LEDa. The light emitting element LEDa may be arranged so that the anode electrode of the light emitting element LEDa is connected to a second electrode of the first transistor M1a and the cathode electrode of the light emitting element LEDa is connected to a second driving voltage VSS. A voltage level of the second driving voltage VSS may be lower than that of the first driving voltage VDD. The second driving voltage VSS may be a ground.

Thus, the display pixel 101 configured as described above may operate so that the data voltage Vdata is transferred to the first node N1a, when the gate signal transferred through the gate line GL is transmitted to the gate electrode of the second transistor M2a. When the data voltage Vdata is transferred to the first node N1a, the first transistor M1a may transmit the driving current Ida corresponding to the data voltage Vdata to the light emitting element LEDa. At this point, the first transistor M1a and the second transistor M2a may utilize transistors including low-temperature polysilicon to reduce variations in electron mobility.

Then, the sensing pixel 102 may include a first sensing transistor SM1 arranged between a driving signal line SL1 and the sensing electrode SE to connect or disconnect the driving signal line SL1 and the sensing electrode SE in response to a control signal Cons, and a second sensing transistor SM2 arranged between a read-out wiring SL2 and the driving power line VL supplying the first driving voltage VDD to connect or disconnect the driving power line VL and the read-out wiring SL2.

The first sensing transistor SM1, the driving signal line SL1, and the read-out wiring SL2 may be disposed in a bezel area which may be formed of an edge portion where any image is not displayed on the display panel 110.

Referring then to FIG. 5, it is seen that the sensing pixel 102 may operate in a separated mode of a first sensing period TS1 and a second sensing period TS2.

First, the driving electrode DE of the sensing pixel 102 may receive a predetermined frequency of a frequency signal fs, in the first sensing period TS1. The frequency signal fs transferred to the driving electrode DE may be transmitted from the second controller 122 as shown in FIG. 1A. At this time, the first voltage V1 may be transmitted to the driving signal line SL1, in which the first voltage V1 may be of a constant voltage. Then, the first sensing transistor SM1 disposed between the sensing electrode SE and the driving signal line SL1 may be turned on upon receiving the control signal Cons.

When the frequency signal fs is supplied to the driving electrode DE of the piezoelectric element 200, the piezoelectric material m1018 can output an ultrasonic signal corresponding to the frequency signal fs. At this point, the first voltage V1 is applied to the sensing electrode SE, and the second sensing transistor SM2 may be kept in OFF state by the first voltage V1. Hence, the read-out wiring SL2 may be in a floating state with the piezoelectric element 200, and so no signal may be transferred to the read-out wiring SL2. The control signal Cons may be transmitted from the second controller 122 as shown in FIG. 1A.

Further, for the second sensing period TS2, a connection between the sensing electrode SE and the driving signal line SL1 can be cut off. Thus, the first sensing transistor SM1 may be turned off by the control signal Cons, so that the connection between the sensing electrode SE and the driving signal line SL1a may be disconnected. The piezoelectric element 200 can receive an ultrasonic signal output from the first sensing period TS1, after being reflected by an object, when the object is adjacent thereto (e.g., an ultrasonic signal bounced off a user's finger). Since the piezoelectric element 200 is configured to convert the ultrasonic signal received by the piezoelectric material m1018 into an electrical signal corresponding thereto, the sensing electrode SE is allowed to output a first sensing signal ss1 at a predetermined frequency. When the first sensing signal ss1 is output at a predetermined frequency from the sensing electrode SE, the second sensing transistor SM2 connected to the sensing electrode SE may receive the first sensing signal ss1 from the gate electrode, so that the second sensing transistor SM2 repeats turning-on/turning-off according to the frequency of the first sensing signal ss1.

Then, the second sensing signal ss2 corresponding to the first sensing signal ss1 is transmitted to the read-out wiring SL2 by such turning-on/turning-off of the second sensing transistor SM2. As the second sensing transistor SM2 is connected to the driving power line VL transmitting the first driving voltage VDD, the connection and disconnection of the read-out wiring SL2 and the driving power line VL can be repeated by means of turning on/off of the second sensing transistor SM2. Accordingly, the second sensing signal ss2 corresponding to the first sensing signal ss1 may be transmitted to the read-out wiring SL2. Furthermore, the transmitted second sensing signal ss2 can correspond to an amplified version of the first sensing signal ss1 based on the first driving voltage VDD.

The first sensing transistor SM1 and the second sensing transistor SM2 may include at least one oxide semiconductor. When the first sensing transistor SM1 and the second sensing transistor SM2 have the oxide semiconductor, the transistor with the oxide semiconductor may have a characteristic of low leakage current, so the first sensing transistor SM1 and the second sensing transistor SM2 may have the characteristics of low leakage current. Hence, the first sensing transistor SM1 and the second sensing transistor SM2 can prevent signals accruing from the leakage current from being transmitted to the driving signal line SL1 and the read-out wiring SL2, thereby enabling more accurate sensing results to be obtained.

Figure 6:
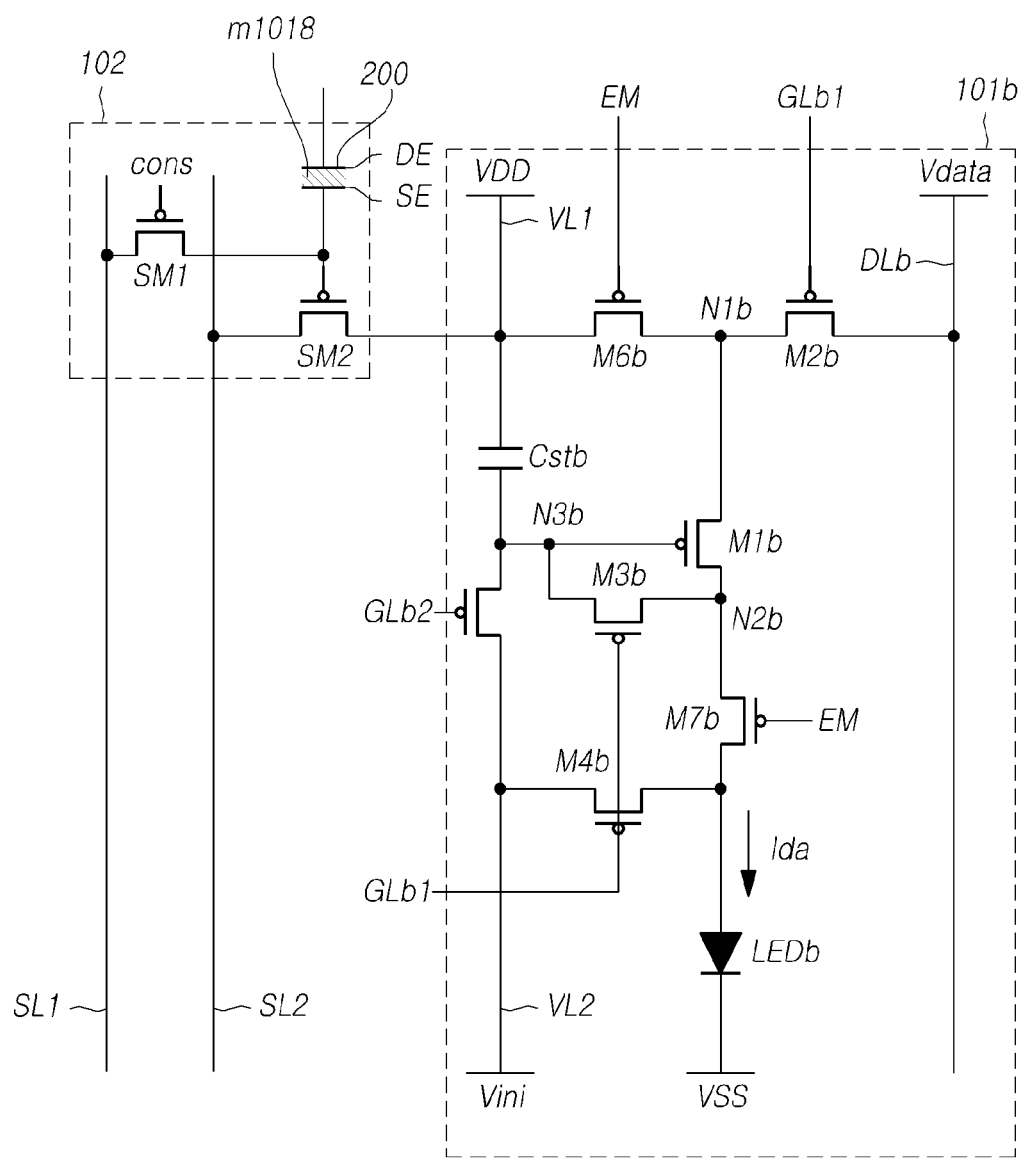
FIG. 6 is a circuit diagram illustrating another embodiment of a display pixel and a sensing pixel according to embodiments of the present disclosure.
Figure 7:
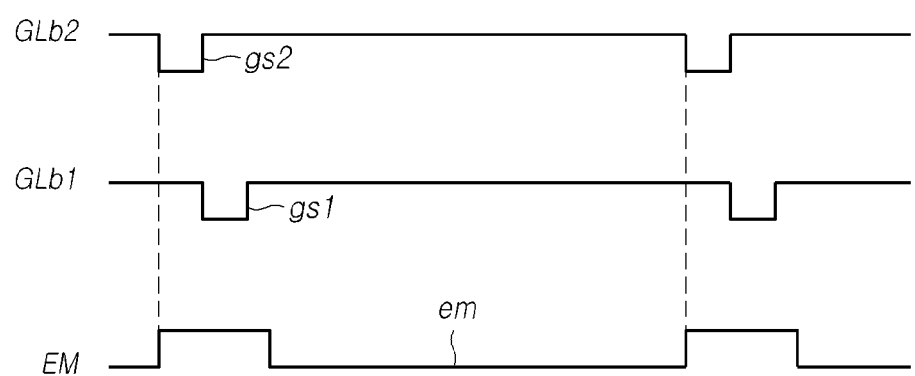
FIG. 7 is a timing diagram illustrating driving of a display pixel according to embodiments of the present disclosure.

FIG. 6 shows a circuit diagram illustrating another embodiment of a display pixel and a sensing pixel according to embodiments of the present disclosure, and FIG. 7 shows a timing diagram illustrating driving of a display pixel according to embodiments of the present disclosure.

Referring first to FIG. 6, a light emitting element LEDb may be disposed on the piezoelectric element layer 1300 as illustrated in FIG. 2. The light emitting element LEDb may include an anode electrode, a cathode electrode, and a light emitting material layer disposed between the anode electrode and the cathode electrode. The light emitting element LEDb may be formed of an organic light emitting element including an organic material of light emitting material layer or an inorganic light emitting element including an inorganic material of light emitting material layer.

The piezoelectric element 200 may include a sensing electrode SE, a driving electrode DE, and a piezoelectric material m1018 disposed between the sensing electrode SE and the driving electrode DE, respectively. The piezoelectric element 200 may be a piezoelectric element layer 1300 disposed on the sensor array 1200 as illustrated in FIG. 2 or part thereof. The sensing electrode SE and the driving electrode DE may be part of the sensing electrode line 1017a and the driving electrode line 1019a, respectively, and the piezoelectric material m1018 may be part of the piezoelectric material layer 1018.

The display pixel 101b may include a first transistor M1b to receive a first driving voltage VDD and a data voltage Vdata to generate a driving current Idb corresponding to the data voltage Vdata, a second transistor M2b to transfer the data voltage Vdata to the first transistor M1b in response to a first gate signal gs1, a third transistor M3b to have the first transistor M1b diode-connected in response to the first gate signal gs1, a fourth transistor M4b to transmit an initialization voltage Vini to the light emitting element LEDb in response to the first gate signal gs1, a capacitor Cstb to maintain the data voltage Vdata transmitted to the first transistor M1a, a fifth transistor M5b to transmit the initialization voltage Vini to the capacitor Cstb in response to the second gate signal gs2, a sixth transistor M6b to transmit the first driving voltage VDD to the first transistor M1a in response to a light emitting control signal em, and a seventh transistor (M7b) to transfer a driving current Idb to the light emitting element LEDb in response to the light emitting control signal em. Here, the display driving transistor illustrated in FIG. 2 may correspond to the seventh transistor M7b.

The first transistor M1b may be arranged with a first electrode connected to a first node N1b and a second electrode connected to a second node N2b. A gate electrode of the first transistor M1b may be connected to a third node N3b. Further, the second transistor M2b may be arranged with a first electrode connected to a data line DLb transferring the data voltage Vdata and a second electrode connected to the first node N1b. The second transistor M2b may be connected to a first gate line GLb1 through which the gate electrode transfers a first gate signal gs1.

Then, the third transistor M3b may be arranged with a first electrode connected to the second node N2b and a second electrode connected to the third node N3b. The gate electrode of the third transistor M3b may be connected to the first gate line GLb1. Further, the fourth transistor M4b may be arranged with a first electrode connected to an initialization voltage line VL2 transmitting the initialization voltage Vini, and a second electrode connected to the anode electrode of the light emitting element LEDb. The gate electrode of the fourth transistor M4b may be connected to the first gate line GLb1.

The capacitor Cstb may be coupled between the third node N3b and the driving power line VL1 transmitting the first driving voltage VDD. In the fifth transistor M5b, a first electrode of the fifth transistor M5b may be connected to the initialization voltage line VL2 and a second electrode of the fifth transistor M5b may be connected to the third node N3b. The gate electrode of the fifth transistor M5b may be connected to the second gate line GLb2 through which the second gate signal gs2 is transmitted.

In the sixth transistor M6b, a first electrode may be connected to the driving power line VL1 and a second electrode may be connected to the first node N1a. The gate electrode of the sixth transistor M6b may be connected to the light emitting control signal line EM transmitting the light emitting control signal EM. In the seventh transistor M7b, a first electrode may be connected to the second node N2b and a second electrode may be connected to the anode electrode of the light emitting element LEDa. The gate electrode of the seventh transistor M7b may be connected to the lighting emitting control signal line EM.

Referring then to FIG. 7, the second gate signal gs2 may be transmitted to the second gate line GLb2 in the display pixel 101b. When the second gate signal gs2 is transmitted, the fifth transistor M5b may be turned on so that the initialization voltage Vini can be transmitted to the third node N3b. The capacitor Cstb may be initialized by the initialization voltage Vini transmitted to the third node N3b. Then, when the first gate signal gs1 is transmitted to the first gate line GLb1, the fifth transistor M5b may be turned off while the second transistor M2b, the third transistor M3b, and the fourth transistor may be all turned on.

When the second transistor M2b, the third transistor M3b, and the fourth transistor M4b are turned on, the data voltage Vdata transferred to the data line DLb may be then transferred to the first node N1b. Further, the third transistor M3b is turned on, so that the second node N2b and the third node N3b of the first transistor M1b are connected to make the first transistor M1b diode-connected. As the first transistor M1b is made diode-connected, a current may flow in a direction from the first node N1b to the second node N2b. Due to the current flowing from the first node N1b to the second node N2b, a threshold voltage of the first transistor M1b and a voltage corresponding to the data voltage Vdata may be stored in the third node N3b. Then, the capacitor Cst may store the voltage at the third node N3b.

Then, when the light emitting control signal em is transmitted to the light emitting control signal line EM, the second to fifth transistors M2b to M5b may be turned off, while the sixth transistors M6b and seventh Transistor M7b may be turned on. When the sixth transistor M6b is turned on, the first driving voltage VDD transmitted to the power line VL1 is transferred to the first node N1b. At this point of time, as the capacitor Cst stores the voltage of the third node N3b and the seventh transistor M7b is kept to be turned on, the first transistor M1a may operate so that a current flows in a direction from the first node N1b to the second node N2b, thereby allowing the driving current Idb to be fed to the light emitting element LEDa.

At this point in time, the data voltage Vdata and a voltage corresponding to the threshold voltage of the first transistor M1b are stored in the third node N3b, so the driving current Idb may flow with the threshold voltage of the first transistor M1b compensated. In addition, the first transistor Mia to the seventh transistor M7b may include low-temperature polysilicon in order to reduce variations in electron mobility.

In addition, the sensing pixel 102 may include a first sensing transistor SM1 disposed between the driving signal line SL1 and the sensing electrode SE to connect or disconnect the driving signal line SL1 and the sensing electrode SE in response to a control signal cons, and a second sensing transistor SM2 disposed between the read-out wiring SL2 and the driving power line VL1 supplying the first driving voltage VDD to connect or disconnect the driving power line VL and the read-out wiring SL2. The first sensing transistor SM1, the driving signal line SL1, and the read-out wiring SL2 may be disposed on the bezel area that is an edge portion where no image is displayed on the display panel 110.

As illustrated in FIG. 5, the sensing pixel 102 may transmit a frequency signal fs having a predetermined frequency to the driving electrode DE for the first sensing period TS1. The frequency signal fs transmitted to the driving electrode DE may be transmitted from the second controller 122 as shown in FIG. 1A. At this point, the first voltage V1 may be transmitted to the driving signal line SL1, wherein the first voltage V1 may be a constant voltage. Further, the first sensing transistor SM1 disposed between the sensing electrode SE and the driving signal line SL1 may be turned on upon receiving the control signal cons.

When the frequency signal fs is transferred to the driving electrode DE of the piezoelectric element 200, the piezoelectric material m1018 may output an ultrasonic signal corresponding to the frequency signal fs. At this point in time, as a constant voltage is applied to the sensing electrode SE, the second sensing transistor SM2 may be kept in off state. Therefore, the read-out wiring SL2 may be in a floating state with the piezoelectric element 200, and no signal may be transferred to the read-out wiring SL2. Further, the control signal cons may be provided from the second controller 122 shown in FIG. 1.

For the second sensing period TS2, the connection between the sensing electrode SE and the driving signal line SL1 may be disconnected. The first sensing transistor SM1 may be turned off by the control signal cons, so that the connection between the sensing electrode SE and the driving signal line SL1 may be blocked. Further, when an object (e.g., a user's finger) is placed adjacent to the piezoelectric element 200, this piezoelectric element 200 can receive the ultrasonic signal output during the first sensing period Ts1, being reflected by the object. The piezoelectric material m1018 of the piezoelectric element 200 may generate an electrical signal in response to the received ultrasonic signal, thereby outputting the first sensing signal ss1 at the predetermined frequency from the sensing electrode SE. When the first sensing signal ss1 having the predetermined frequency is output from the sensing electrode SE, the second sensing transistor SM2 connected to the sensing electrode SE may receive the first sensing signal ss1 at the gate electrode to repeat its turning-on/turning-off in response to the frequency of the first sensing signal ss1.

Then, the second sensing signal ss2 corresponding to the first sensing signal ss1 may be transmitted to the read-out wiring SL2 by turning on/off the second sensing transistor SM2, which may be connected to a driving power line VL transmitting the first driving voltage VDD. Thus, such turning-on/turning-off operations of the second sensing transistor SM2 make it possible for the read-out wiring SL2 and the driving power line VL to be repeatedly connected or disconnected, so that the second sensing signal ss2 corresponding to the first sensing signal ss1 may be transferred to the read-out wiring SL2. Furthermore, the transmitted second sensing signal ss2 can correspond to an amplified version of the first sensing signal ss1 based on the first driving voltage VDD.

Moreover, the first sensing transistor SM1 and the second sensing transistor SM2 may include low-temperature polysilicon. Use of transistors of substantially the same type as the first to seventh transistors (M1b to M7b) included in the display pixel 101, for the first sensing transistor SM1 and the second sensing transistor SM2, will advantageously result in simpler manufacturing processes than using different types of transistors.

Figure 8A:
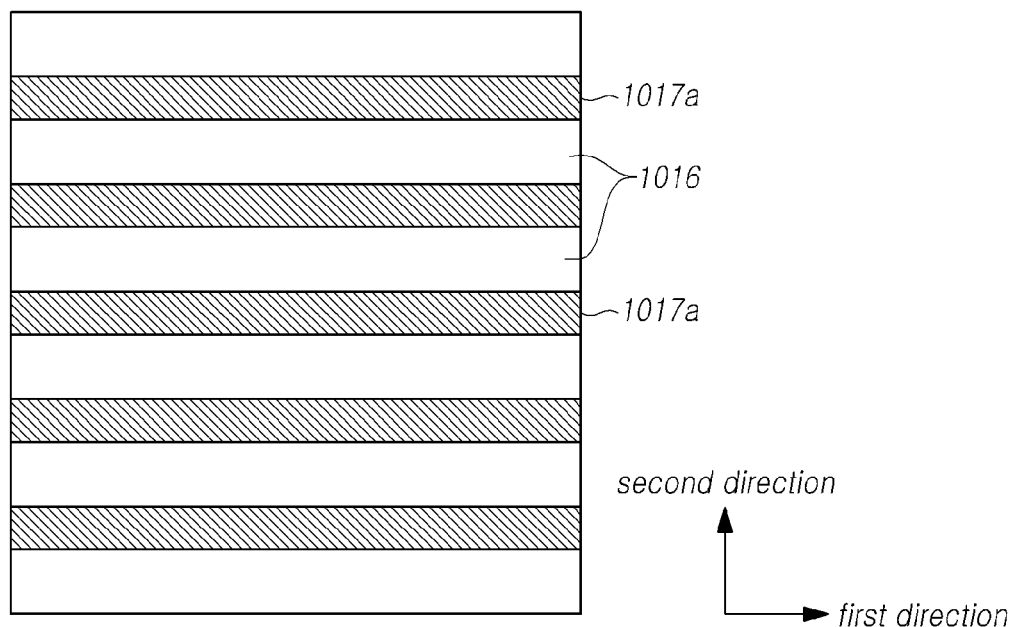
FIG. 8A and FIG. 8B show a plan view illustrating a sensing array according to embodiments of the present disclosure.
Figure 8B:
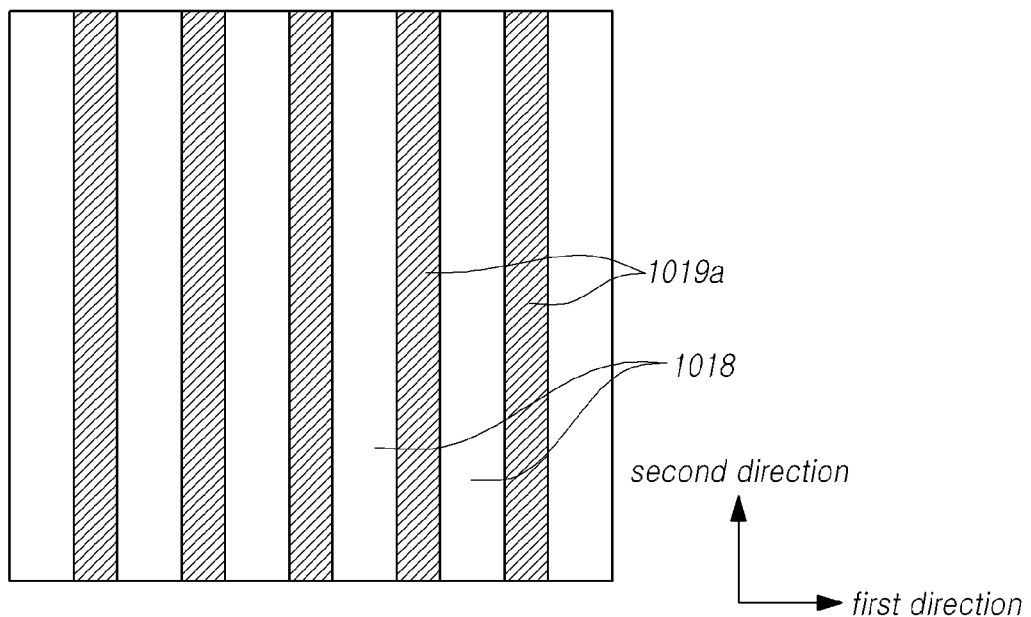

FIGS. 8A and 8B show a plan view for a sensing array according to embodiments of the present disclosure.

Referring first to FIG. 8A, a sensing array may be arranged so that a plurality of sensing electrode lines 1017a may be disposed on the first insulating layer 1016, wherein sensing electrode lines 1017a are spaced apart from each other, extending in the first direction. Further, piezoelectric material layers 1018 may be disposed on the first insulating layer 1016 on which a plurality of sensing electrode lines 1017a are disposed. In addition, a plurality of driving electrode lines 1019a may be disposed on the piezoelectric material layer 1018 as shown in FIG. 8B, in which the plurality of driving electrode lines may be spaced apart from each other, extending in the second direction.

Accordingly, the plurality of sensing electrode lines 1017a and the plurality of driving electrode lines 1019a may cross each other. Further, the region where the sensing electrode line 1017a and the driving electrode line 1019a intersect may correspond to the piezoelectric element 200 as shown in FIGS. 4 and 6.

Figure 9:
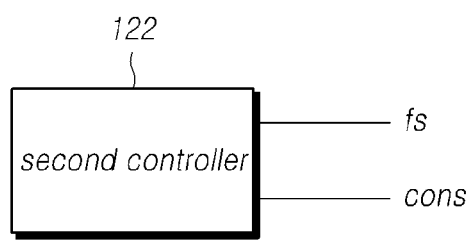
FIG. 9 is a conceptual diagram illustrating a second controller according to embodiments of the present disclosure.

FIG. 9 is a conceptual diagram illustrating a second controller according to embodiments of the present disclosure.

Referring to FIG. 9, the second controller 122 may output a frequency signal fs of a predetermined frequency and a control signal cons. The second controller 122 may be connected to the driving electrode DE to transmit the frequency signal fs to the driving electrode DE. In addition, the second controller 122 may be connected to the gate electrode of the first sensing transistor SM1 to connect or disconnect the driving signal line SL1 and the sensing electrode SE in response to the control signal cons.

Therefore, the second controller 122 may transmit the frequency signal fs to the driving electrode DE, for the first period TS1, as illustrated in FIG. 5, and then control to connect the driving signal line SL1 and the sensing electrode SE. Furthermore, the second controller 122 may cut off the connection between the driving signal line SL1 and the sensing electrode SE, for the second period TS2, to stop outputting of the frequency signal fs, thereby preventing the frequency signal fs from being transmitted to the driving electrode DE.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:
1. A display device comprising:
    a display panel including display pixels having light emitting elements, and sensing pixels having piezoelectric elements; and
    a driving circuit configured to drive the display panel,
    wherein the display panel includes:
        a thin film transistor array disposed on a substrate, the thin film transistor array including display driving transistors included in the display pixels;
        a sensor array disposed on the thin film transistor array, the sensor array including sensor driving transistors included in the sensing pixels;
        a piezoelectric element layer disposed on the sensor array, the piezoelectric element layer including the piezoelectric elements connected to the sensor driving transistors; and
        a light emitting element layer disposed on the piezoelectric element layer, the light emitting element layer including the light emitting elements, and anode electrodes of the light emitting elements are connected to the display driving transistors.

2. The display device according to claim 1, wherein the piezoelectric element layer comprises:
 a driving electrode line configured to receive a frequency signal;
 a sensing electrode line configured to transmit signals to the sensor driving transistors;
 a piezoelectric material layer disposed between the driving electrode line and the sensing electrode line, the piezoelectric material layer having a first hole penetrating through piezoelectric material layer;
 a first auxiliary electrode line disposed to overlap the first hole underneath the piezoelectric material layer, the first auxiliary electrode line being spaced apart from the sensing electrode line; and
 a second auxiliary electrode line disposed on an inner wall of the first hole and connected to the first auxiliary electrode line, the second auxiliary electrode line being spaced apart from the driving electrode line.

3. The display device according to claim 2, further comprising:
 an insulating layer disposed on the driving electrode line, the insulating layer having a second hole penetrating though the insulating layer and overlapping the first hole; and
 an anode electrode disposed on the insulating layer, the anode electrode extending through the second hole to be connected to the second auxiliary electrode line disposed on the inner wall of the first hole.

4. The display device according to claim 2, further comprising:
 an extension electrode disposed between the first auxiliary electrode and a first drain electrode of one of the display driving transistors,
 wherein the first auxiliary electrode line is electrically connected to the first drain electrode via the extension electrode.

5. The display device according to claim 2, wherein a gate electrode of one of the sensor driving transistors is connected to the sensing electrode line.

6. The display device according to claim 2, wherein the driving electrode line and the sensing electrode line are arranged to intersect each other.

7. The display device according to claim 1, wherein the thin film transistor array is configured to generate a driving current in response to a first driving voltage and a data signal, and
 wherein the sensor array is configured to generate a sensing signal in response to the first driving voltage and an ultrasonic signal reflected off an object.

8. The display device according to claim 1, wherein at least one of the display pixels comprises:
 a first transistor configured to receive a first driving voltage and a data voltage to generate a driving current in response to the data voltage, and supply the driving current to one of the anode electrodes;
 a second transistor configured to transmit the data signal to the first transistor in response to a gate signal; and
 a capacitor configured to maintain the data voltage transferred to the first transistor.

9. The display device according to claim 1, wherein at least one of the display pixels comprises:
 a first transistor configured to receive a first driving voltage and a data voltage to generate a driving current;
 a second transistor configured to transfer the data voltage to the first transistor in response to a first gate signal;
 a third transistor configured to have the first transistor be diode-connected in response to the first gate signal;
 a fourth transistor configured to transmit an initialization voltage to one of the light emitting elements in response to the first gate signal;
 a capacitor configured to maintain a voltage corresponding to the data voltage applied to the first transistor;
 a fifth transistor configured to transmit the initialization voltage to the capacitor in response to a second gate signal;
 a sixth transistor configured to transmit the first driving voltage to the first transistor in response to a light emitting control signal; and
 a seventh transistor configured to transfer the driving current to the one of the light emitting elements in response to the light emitting control signal.

10. The display device according to claim 1, wherein one of the piezoelectric elements comprises:
 a driving electrode;
 a sensing electrode; and
 a piezoelectric material disposed between the driving electrode and the sensing electrode.

11. The display device according to claim 10, wherein one of the sensing pixels comprises:
 a first sensing transistor arranged between a driving signal line and the sensing electrode to connect or disconnect the driving signal line and the sensing electrode in response to a control signal; and
 a second sensing transistor arranged between a read-out wiring configured to output a sensing signal and a driving power line configured to supply a first driving voltage to connect or disconnect the driving power line and the read-out wiring.

12. The display device according to claim 11, wherein the one of the sensing pixels is configured to:
 during a first period of operation while the driving electrode is supplied with a frequency signal, connect the sensing electrode with the driving signal line to receive a first voltage from the driving signal line and disconnect the read-out wiring from the driving power line in response to the first voltage; and
 during a second period of operation while the sensing electrode receives an ultrasonic signal from the piezoelectric material to generate a first sensing signal, transmit a second sensing signal to the read-out wiring in response to the first sensing signal and based on the first driving voltage.

13. The display device according to claim 1, wherein the sensor array is disposed on a protective layer of the thin film transistor array,
 wherein the piezoelectric element layer is disposed on a first insulating film of the sensor array, and
 wherein an anode electrode of one of the light emitting elements is disposed on a second insulating film disposed on the piezoelectric element layer.

14. The display device according to claim 1, wherein the display driving transistors comprise low-temperature polysilicon.

15. The display device according to claim 1, wherein the sensor driving transistors comprise at least one oxide semiconductor.

16. The display device according to claim 1, wherein the driving circuit comprises:
 a first controller configured to control the display pixels;
 a second controller configured to control the sensing pixels;

a gate driver configured to supply a gate signal; and a data driver configured to supply a data signal.

17. The display device according to claim 1, wherein the driving circuit comprises:

a first controller configured to control the display pixels; and a second controller configured to:

during a first sensing period, transmit a frequency signal to a driving electrode connected to one of the piezoelectric elements, and connect a driving signal line with a sensing electrode of the one of the piezoelectric elements, and during a second sensing period, disconnect the driving signal line from the sensing electrode when the frequency signal is not transmitted to the driving electrode.

18. The display device according to claim 1, wherein a number of the sensing pixels is less than or equal to a number of the display pixels.

19. A display panel comprising:

a thin film transistor array disposed on a substrate, the thin film transistor array including display driving transistors included in display pixels;

a sensor array disposed on the thin film transistor array, the sensor array including sensor driving transistors included in sensing pixels;

a piezoelectric element layer disposed on the sensor array, the piezoelectric element layer including piezoelectric elements connected to the sensor driving transistors; and a light emitting element layer disposed on the piezoelectric element layer, the light emitting element layer including light emitting elements of the display pixels, and anode electrodes of the light emitting elements are connected to the display driving transistors.

20. The display panel according to claim 19, wherein the piezoelectric element layer comprises:

a driving electrode line configured to receive a frequency signal for outputting an ultrasonic signal corresponding to the frequency signal;

a sensing electrode line configured to transmit signals to the sensor driving transistors;

a piezoelectric material layer disposed between the driving electrode line and the sensing electrode line, the piezoelectric material layer having a first hole penetrating through piezoelectric material layer;

a first auxiliary electrode line disposed to overlap the first hole underneath the piezoelectric material layer, the first auxiliary electrode line being spaced apart from the sensing electrode line; and a second auxiliary electrode line disposed on an inner wall of the first hole and connected to the first auxiliary electrode line, the second auxiliary electrode line being spaced apart from the driving electrode line.

* * * * *